(12) United States Patent
Zelner et al.

(10) Patent No.: US 9,490,314 B1
(45) Date of Patent: Nov. 8, 2016

(54) HIGH-THROUGHPUT DEPOSITION OF A VOLTAGE-TUNABLE DIELECTRIC MATERIAL

(71) Applicant: BLACKBERRY LIMITED, Waterloo (CA)

(72) Inventors: Marina Zelner, Burlington (CA); Susan Nagy, Burlington (CA); Andrew Vladimir Claude Cervin, Oakville (CA); James DiLorenzo, Windham, NH (US)

(73) Assignee: BLACKBERRY LIMITED, Waterloo, Ontario (CA)

( * ) Notice: Subject to any disclaimer, the term of this patent is extended or adjusted under 35 U.S.C. 154(b) by 0 days.

(21) Appl. No.: 14/727,088

(22) Filed: Jun. 1, 2015

(51) Int. Cl.
| | |
|---|---|
| *H01L 21/02* | (2006.01) |
| *H01L 49/02* | (2006.01) |
| *H01L 21/288* | (2006.01) |
| *H01L 21/285* | (2006.01) |
| *H01L 29/49* | (2006.01) |
| *H01L 27/12* | (2006.01) |
| *H01L 21/20* | (2006.01) |

(52) U.S. Cl.
CPC ............ *H01L 28/60* (2013.01); *H01L 21/285* (2013.01); *H01L 21/288* (2013.01); *H01L 21/2022* (2013.01); *H01L 27/1281* (2013.01); *H01L 29/4925* (2013.01); *H01L 2224/4051* (2013.01); *H01L 2224/4851* (2013.01)

(58) Field of Classification Search
CPC .... H01L 28/60; H01L 21/285; H01L 21/288
USPC ....................................................... 257/532
See application file for complete search history.

(56) References Cited

U.S. PATENT DOCUMENTS

| 3,953,876 A * | 4/1976 | Sirtl .................... C30B 25/02 |
| | | 136/244 |
| 6,846,752 B2 | 1/2005 | Chambers et al. |
| 2006/0211243 A1* | 9/2006 | Ishizaka ................ C23C 16/14 |
| | | 438/680 |
| 2007/0032004 A1 | 2/2007 | Ramaswamy et al. |
| 2013/0003254 A1* | 1/2013 | Koutsaroff ............ C01G 23/006 |
| | | 361/281 |
| 2014/0339961 A1* | 11/2014 | Maejima ............. H01L 41/0805 |
| | | 310/358 |

FOREIGN PATENT DOCUMENTS

| WO | 2011066370 A2 | 6/2011 |
| WO | 2014092807 A1 | 6/2014 |

* cited by examiner

*Primary Examiner* — Tod T Van Roy
*Assistant Examiner* — Vu A Vu
(74) *Attorney, Agent, or Firm* — Perry + Currier, Inc.

(57) ABSTRACT

High-throughput deposition of a voltage-tunable dielectric material onto a substrate comprising a conductive electrode is provided. Respective gradients in at least two grain size defining parameters of the deposition are simultaneously provided, the respective gradients occurring for a first time period thereby producing a smoothly changing columnar crystalline habit of the voltage-tunable dielectric material. When the first time period has ended, the deposition continues for a second time period where the grain size defining parameters are held constant. In particular, the smoothly changing columnar crystalline habit of the voltage-tunable dielectric material is intentionally distorted by simultaneously providing the respective gradients in the in at least two grain size defining parameters of the deposition.

16 Claims, 7 Drawing Sheets

```
┌─────────────────────────────────────────────────────────────┐
│ Simultaneously Providing Respective Gradients In At Least Two │
│    Grain Size Defining Parameters Of The Deposition, The      │
│    Respective Gradients Occurring For A First Time Period     │
│  Thereby Producing A Smoothly Changing Columnar Crystalline   │
│         Habit Of The Voltage-Tunable Dielectric Material      │
│                              301                              │
└─────────────────────────────────────────────────────────────┘
                              │
                              ▼
┌─────────────────────────────────────────────────────────────┐
│ When The First Time Period Has Ended, Continuing Deposition  │
│   For A Second Time Period Where The Grain Size Defining     │
│              Parameters Are Held Constant                    │
│                             303                              │
└─────────────────────────────────────────────────────────────┘
```

300

Fig. 3

HIGH-THROUGHPUT DEPOSITION OF A VOLTAGE-TUNABLE DIELECTRIC MATERIAL

FIELD

The specification relates generally to sputter deposition of voltage-tunable dielectrics, and specifically to a high-throughput deposition of a voltage-tunable dielectric material.

BACKGROUND

Sputter-deposited polycrystalline dielectrics generally have a preferentially oriented columnar crystalline habit (i.e. the tendency of the grains to form columnar crystals during deposition). Columnarity is generally aligned with the cathode bias of the sputtering tool. When the dielectrics are used to form tunable capacitors, and the like (and hence can have, for example, a perovskite structure, a pyrochlore structure, and the like), they are generally driven at a tuning bias of about 10% to about 40% of the hard breakdown voltage, which means that can they can be more susceptible to failure than non-tunable dielectrics, which are generally driven at 5% to 10% of the hard breakdown voltage. The biasing electric field of the capacitor is also generally aligned with the direction of columnarity. Hence, columnar crystalline habit will result in grain boundaries oriented from the lower to the top electrode and also aligned with the tuning electric field of the capacitor. Time dependent dielectric breakdown (TDDB) is the ageing of the capacitor under the bias and temperature. In TDDB processes, conductive dendrite growth causes the dielectric breakdown. The grain boundaries are the weak points of the polycrystalline film. In cases of grain boundaries aligned with the tuning electric field, conductive dendrites from the electrodes will quickly penetrate the crystalline structure leading to failure resulting in low mean time to failure (MTTF) of the devices. Furthermore, space-charge effects in the dielectric can limit the applications for capacitors using these dielectrics because of lack of control of the capacitance during product life under bias and losses in high frequency applications. While hillock suppression in the conductive electrode can be achieved by depositing a micro-crystalline sub-layer of dielectric, and/or a randomly oriented grain structure of dielectric, onto the conductive electrode prior to forming a columnar crystalline structure, the high frequency dissipation factor of such capacitors is high when the hillock suppression, and/or columnarity modification, is achieved by introducing the sub-layer as it results in an abrupt additional interface in the dielectric.

BRIEF DESCRIPTIONS OF THE DRAWINGS

For a better understanding of the various implementations described herein and to show more clearly how they may be carried into effect, reference will now be made, by way of example only, to the accompanying drawings in which:

FIG. 3 depicts a schematic block diagram of a method for depositing a voltage-tunable dielectric material, according to non-limiting implementations.

DETAILED DESCRIPTION

Figure 1:
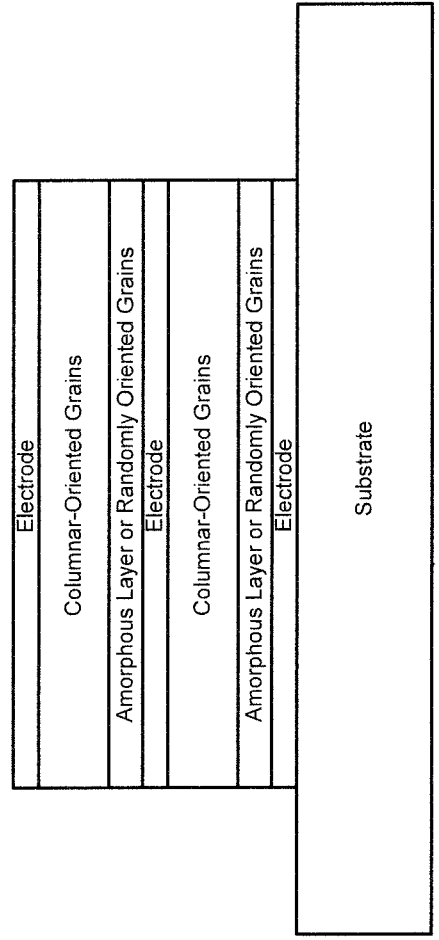
FIG. 1 depicts a tunable dielectric capacitor according to the prior art.

In general, this disclosure is directed to high-throughput deposition of a voltage-tunable dielectric material, for example for use in a tunable capacitor. Such voltage-tunable dielectric material can include dielectrics having a pyrovskite structure, a pyrochlore structure, and the like. The deposition of the voltage-tunable dielectric is performed in two stages: a first stage, that occurs for a first time period, in which respective gradients in at least two grain size defining parameters are simultaneously provided which produces a smoothly changing columnar crystalline habit in the dielectric; and a second stage, that occurs for a second time period, in which deposition continues and the grain size defining parameters are held constant. In general, the values of the grain size defining parameters at the end of the first stage are the values of the grain size defining parameters used in the second stage to eliminate and/or reduce abrupt interfaces between the portion of the dielectric formed in the first stage and the portion of the dielectric formed in the second stage. Grain size defining parameters can include substrate temperature, pressure in the deposition chamber and power, for example RF power. Providing a gradient for at least two of these parameters leads to elimination and/or reduction of an abrupt interface there between. Furthermore, beginning deposition during ramping and/or gradients of the two or more grain size defining parameters, leads to better throughput in a deposition system. Indeed, while present techniques can be particularly useful during sputter deposition of perovskite dielectrics, the present techniques can be applied to other types of deposition of voltage-tunable dielectrics.

An aspect of the specification provides a method of deposition of a voltage-tunable dielectric material onto a substrate comprising a conductive electrode, the method comprising: simultaneously providing respective gradients in at least two grain size defining parameters of the deposition, the respective gradients occurring for a first time period thereby producing a smoothly changing columnar crystalline habit of the voltage-tunable dielectric material; and, when the first time period has ended, continuing deposition for a second time period where the grain size defining parameters are held constant. In particular, in present implementations, the smoothly changing columnar crystalline habit of the voltage-tunable dielectric material is intentionally distorted.

A film of the voltage-tunable dielectric material formed on the conductive electrode during the deposition can be polycrystalline.

The at least two grain size defining parameters can comprise two or more of power, substrate temperature and pressure of a deposition chamber in which the deposition is occurring.

The at least two grain size defining parameters can comprise substrate temperature, a starting substrate temperature in the first time period being in a range of about 20° C. to about 300° C. and an ending substrate temperature in the first time period being in a range of about 600° C. to about 1000° C. The starting substrate temperature in the first time period can be below a stress relief temperature of the conductive electrode.

The deposition can comprise sputtering and at least two grain size defining parameters can comprise sputtering power, a starting cathode power density in the first time period being about 0 W/cm2 and an ending cathode power density in the first time period being in a range of about 0.7 W/cm2 to about 2.8 W/cm2.

The at least two grain size defining parameters can comprise pressure of a deposition chamber in which the deposition is occurring, a starting pressure in the first time period being in a range of about 0.2 Pa to about 2 Pa and an ending pressure in the first time period being in a range of about 0.1 Pa to about 1 Pa.

The at least two grain size defining parameters can comprise pressure of a deposition chamber in which the deposition is occurring, wherein the pressure one of: decreases over the first time period or increases over the first time period.

The deposition can comprise one or more of: sputtering, magnetron sputtering, CVD (chemical vapour deposition), PECVD (plasma-enhanced chemical vapour deposition), and MOCVD (metalorganic chemical vapour deposition).

One or more of the respective gradients can occur in one or more steps during the first time period.

One or more of the respective gradients can comprise a temporary pause in a change of the at least two grain size defining parameters during the first time period.

The first time period can be in a range of about 50% to about 100% of the second time period.

The method can further comprise depositing a second conductive electrode on the voltage-tunable dielectric material after the second time period.

The method can further comprise repeating deposition of the voltage-tunable dielectric material onto the second conductive electrode, including: simultaneously providing further respective gradients in at least two grain size defining parameters of the deposition, the further respective gradients occurring for a third time period; when the third time period has ended, continuing deposition for a fourth time period where the grain size defining parameters are held constant; and depositing a third conductive electrode on the voltage-tunable dielectric material after the fourth time period.

The method can further comprise forming a capacitor on the substrate of one or more layers of the voltage-tunable dielectric material.

The smoothly changing columnar crystalline habit can comprise columns of the voltage-tunable dielectric material changing from columns of a first width adjacent the conductive electrode to columns of a second width larger than the first width distal the conductive electrode. In particular, in present implementations, the smoothly changing columnar crystalline habit of the voltage-tunable dielectric material is intentionally distorted.

The voltage-tunable dielectric material can comprise one or more of a ferroelectric material, a perovskite material, a pyrochlore material, barium strontium titanate (BST), lead zirconate titanate (PZT), lead lanthanum zirconate titanate (PLZT), strontium bismuth tantalate (SBT), lithium niobate, bismuth lanthanum titanate (BLT), and lead scandium titanate.

Another aspect of the specification provides a device comprising: a substrate; a first conductive electrode on the substrate; a voltage-tunable dielectric material on the first conductive electrode, the voltage-tunable dielectric material comprising: a first portion adjacent the first conductive electrode, the first portion comprising a smoothly changing columnar crystalline habit; and a second portion on the first portion, the second portion comprising a generally constant columnar crystalline habit; and, a second conductive electrode on the second portion of the voltage-tunable dielectric material. In particular, in present implementations, the smoothly changing columnar crystalline habit of the voltage-tunable dielectric material is intentionally distorted.

The device can further comprise one or more of: a capacitor on the substrate comprising one or more layers of the voltage-tunable dielectric material; and more than one conductive electrode/dielectric/conductive electrode structure stacked on top of each other.

Another aspect of the specification provides a system for depositing a voltage-tunable dielectric material onto a substrate comprising a conductive electrode, the system comprising: a deposition chamber; a substrate holder configured to hold the substrate; a substrate temperature control device; a pressure control device configured to control pressure in the deposition chamber; a power control device configured to control deposition power; and a computing device configured to control the substrate temperature control device, the pressure control device, and the power control device to: simultaneously provide respective gradients in at least two grain size defining parameters of the deposition, the respective gradients occurring for a first time period thereby producing a smoothly changing columnar crystalline habit of the voltage-tunable dielectric material; and, when the first time period has ended, continue deposition for a second time period where the grain size defining parameters are held constant. In particular, in present implementations, the smoothly changing columnar crystalline habit of the voltage-tunable dielectric material is intentionally distorted.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

Attention is next directed to FIG. 1 which schematically depicts a dual tunable capacitor device formed according to the prior art in which an amorphous layer of dielectric and/or a randomly oriented grain structure of the dielectric is deposited onto an conductive electrode (on a substrate) prior to forming columnar oriented grains, after which a second conductive electrode is deposited forming a first capacitive structure. A second similar capacitive structure is formed on the first capacitive structure. At least the randomly oriented grain structure can improve reliability of such capacitors, as compared to capacitors without the randomly oriented grain structure, by modifying the columnar habit of the columnar oriented grains, but it introduces an additional abrupt interface between the dielectric with randomly oriented grains and the columnar one. This causes an increase of the dielectric loss in the hybrid dielectric structure. In other words, the abrupt interface between the amorphous layer and/or the randomly oriented grain structure, and the columnar-oriented grains leads to a high frequency dissipation factor, as well as additional RF (radio-frequency) losses from charged defects caused by interfacial states at the abrupt interface.

Figure 2:
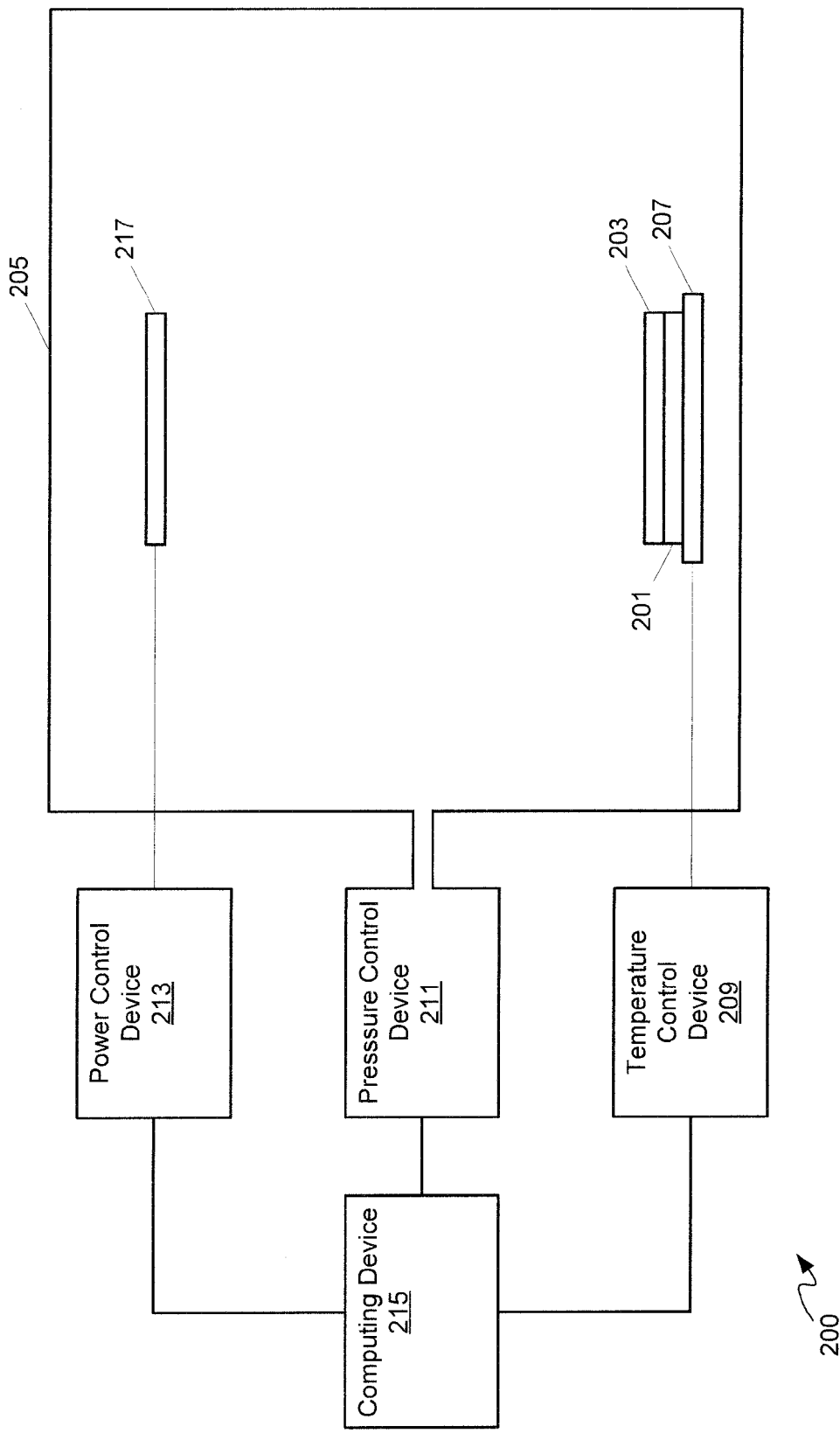
FIG. 2 depicts a system for depositing a voltage-tunable dielectric material, according to non-limiting implementations.

Attention is next directed to FIG. 2 which depicts a system 200 for depositing a voltage-tunable dielectric material onto a substrate 201 comprising a conductive electrode 203, system 200 comprising: a deposition chamber 205; a substrate holder 207 configured to hold substrate 201; a substrate temperature control device 209; a pressure control device 211 configured to control pressure in deposition chamber 205; a power control device 213 configured to control deposition power; and a computing device 215 configured to control substrate temperature control device 209, pressure control device 211, and power control device 213 to: simultaneously provide respective gradients in at least two grain size defining parameters of the deposition, the respective gradients occurring for a first time period thereby producing a smoothly changing columnar crystalline habit of the voltage-tunable dielectric material; and, when the first time period has ended, continue deposition for a second time period where the grain size defining parameters are held constant. In particular, in present implementations, the smoothly changing columnar crystalline habit of the voltage-tunable dielectric material is intentionally distorted using techniques described herein. The voltage-tunable dielectric material can include one or more a material having a perovskite structure, a pyrochlore structure, and the like; other types of voltage-tunable dielectric material will occur to persons of skill in the art and are within the scope of present implementations.

As depicted, system 200 further comprises material 217 comprising at least one voltage-tunable dielectric source material. For example, in specific non-limiting implementations, system 200 comprises a sputter-deposition system and material 217 comprises a sputtering target and/or a magnetron sputtering target. However, in other implementations, system 200 can comprise a CVD (chemical vapour deposition) deposition chamber, a PECVD (plasma-enhance CVD) deposition chamber, a MOCVD (metalorganic chemical vapour deposition) deposition chamber and the like, with components of system 200 adapted accordingly.

While not depicted, system 200 can further comprise components for depositing conductive electrode 203 onto substrate 201. Substrate 201 can include, but is not limited to silicon, alumina (including glazed and ZTA), sapphire, silicon carbide, magnesium silicate (including Forsterite) and/or any other type of insulating, semi-insulating or semi-conducting material. While not depicted insulating layers can be deposited between substrate 201 and conductive electrode 203, such insulating layers including, but not limited to, $SiO_2$ and a hermetic insulating layer, such as $Si_3N_4$. In some implementations, system 200 can be adapted to deposit such insulating layers. Conductive electrode 203 comprises a conducting material including, but not limited to, aluminum, gold, copper, platinum, iridium, conductive oxides, nitrides, and the like. Furthermore, conductive electrode 203 and/or insulating layers between conductive electrode 203 and substrate 201 can be patterned, for example using photolithographic methods and the like.

Substrate holder 207 generally comprises components connected to substrate temperature control device 209 configured to heat substrate 201 under control of substrate temperature control device 209; such components can include, but are not limited to, heaters, heating filaments, infrared lamps, thermoelectric heaters, and the like. Pressure control device 211 generally comprises a device for controlling gas flow into, and pumping speed out of, deposition chamber 205; such gases can be used to form the voltage-tunable dielectric onto conductive electrode 203, such that deposition of material 217 onto conductive electrode 203 occurs in a reactive ambient atmosphere, for example using $O_2$, $N_2$, fluorine and the like; hence, while not depicted, system 200 generally comprises a source of such gases. Power control device 213 is generally configured to control deposition power of material 217 onto conductive electrode 203; for example, when system 200 comprises a sputtering deposition system, power control device 213 can comprise a sputtering power control device electrically connected to material 217, which can comprise a sputter target. Hence, increasing or decreasing the power of the deposition using power control device 213 can result in increasing or decreasing the rate of deposition.

System 200 can further comprise other components for forming and/or depositing and/or patterning thin films at substrate 201. For example, system 200 can comprise a device fabrication system, and/or be a component of a device fabrication system.

In general, the voltage-tunable dielectric material deposited using techniques described herein can comprises one or more of a ferroelectric material, a perovskite material, a pyrochlore material, barium strontium titanate (BST), lead zirconate titanate (PZT), lead lanthanum zirconate titanate (PLZT), strontium bismuth tantalate (SBT), lithium niobate, bismuth lanthanum titanate (BLT), and lead scandium titanate. Hence, material 217 can comprise one or more material components that can use to form such voltage-tunable dielectric material during deposition, for example in an ambient reactive atmosphere, but material 217 need not comprise the voltage-tunable dielectric material itself.

Computing device 215 is generally in communication with each of temperature control device 209, pressure control device 211 and power control device 213 to respectively control each of substrate temperature during deposition, pressure in deposition chamber 205 during deposition, and power during deposition (and hence a rate of deposition). While not depicted, computing device 215 comprises one or more hardware processors, one or more memories (including non-volatile memory and volatile memory) and one or more communication interfaces configured to communicate with each of temperature control device 209, pressure control device 211 and power control device 213. Computing device 215 can store instructions which, when processed by computing device 215, cause computing device 215 to control deposition of voltage-tunable dielectric materials onto conductive electrode 203 according to techniques described herein. Nonetheless, at least one of substrate temperature during deposition, pressure in deposition chamber 205 during deposition, and power during deposition can be controlled by a device other than computing device 215 and/or manually controlled.

It is appreciated that substrate temperature during deposition, pressure in deposition chamber 205 during deposition, and power during deposition, are each grain size defining parameters of the deposition. In other words, each of substrate temperature during deposition, pressure in deposition chamber 205 during deposition, and power during deposition cause a change in grain size during deposition. According to present implementations, at least two of grain size defining parameters of the deposition are provided with respective gradients during a first time period of deposition of voltage-tunable dielectric material onto conductive electrode 203, and that such grain size defining parameters can be controlled by computing device 215 controlling: temperature control device 209 (e.g. to control temperature), pressure control device 211 (e.g. to control pressure) and power control device 213 (e.g. to control power). However, other grain size defining parameters that can be controlled during deposition are within the scope of present implementations including, but not limited to, a bias voltage on substrate 201, reactive gas residence time (e.g. a ratio of reactive gas flow/total gas flow used in CVD deposition and sputtering deposition), reactive gas ratio (e.g. a ratio of reactive gas flow/total gas flow, and used in at least CVD deposition and sputtering deposition) and reactive gas residence time ratio (pumping speed/total flow) gas pumping rate, gas flow rate (e.g. in MOCVD depositions), and the like. Other grain size defining parameters will occur to those of skill in the art and are within the scope of present implementations.

Attention is now directed to FIG. 3 which depicts a block diagram of a flowchart of a method 300 for high-throughput deposition of a voltage-tunable dielectric material, according to non-limiting implementations. In order to assist in the explanation of method 300, it will be assumed that method 300 is performed using system 200. Indeed, method 300 is one way in which system 200 can be configured. Furthermore, the following discussion of method 300 will lead to a further understanding of system 200, and its various components. However, it is to be understood that device system 200 can be varied, and need not work exactly as discussed herein in conjunction with each other, and that such variations are within the scope of present implementations.

At block 301, computing device 215 simultaneously provides respective gradients in at least two grain size defining parameters of the deposition, the respective gradients occurring for a first time period thereby producing a smoothly changing columnar crystalline habit of the voltage-tunable dielectric material.

At block 303, when the first time period has ended, computing device 215 continues deposition for a second time period where the grain size defining parameters are held constant.

In other words, during the first time period, at block 301, at least two grain size defining parameters of the deposition change according to respective gradients and once a the first time period ends, the grain size defining parameters are held constant for a second time period. For example, the grain size defining parameters are held constant at the values reached at the end of the first time period to generally eliminate and/or reduce an interface in the resulting film of voltage-tunable dielectric material deposited onto conductive electrode 203.

Furthermore, the grain size defining parameters are selected such that a film of the voltage-tunable dielectric material formed on conductive electrode 203 during the deposition is polycrystalline. In other words, the grain size of the polycrystalline film of the voltage-tunable dielectric material film formed on conductive electrode 203 is controlled during deposition that results in a smoothly changing columnar crystalline habit during the first time period, with a smooth transition to a relatively constant crystalline habit and/or grain size during the second time period, as described in more detail below. In particular, in present implementations, the smoothly changing columnar crystalline habit of the voltage-tunable dielectric material is intentionally distorted using techniques described herein.

In implementations where the at least two grain size defining parameters comprises substrate temperature, a starting temperature in the first time period can be in a range of about 20° C. to about 300° C. and an ending temperature in the first time period can be in a range of about 600° C. to about 1000° C. In general, starting and ending temperatures are selected such that a polycrystalline film of voltage-tunable material forms throughout the entirety of the deposition. As such computing device 215 can be configured to control temperature control device 209 to control the substrate temperature through a given range during the first time period and to hold the substrate temperature constant during the second time period.

However, in order to reduce hillock formation in conductive electrode 203, a starting temperature in the first time period can be below a stress relief temperature of the conductive electrode.

When the deposition comprises sputtering, the at least two grain size defining parameters can comprise sputtering power: a starting sputtering power in the first time period can be about 0 W/cm$^2$ and an ending sputtering power in the first time period can be in a range of about 0.7 W/cm$^2$ to about 2.8 W/cm$^2$. Hence, sputtering power can be expressed in terms of absolute power and/or sputtering power density, and the like. As such computing device 215 can be configured to control power control device 213 to control the deposition power, which can include power density, through a given range during the first time period and to hold the deposition power constant, which can include power density, during the second time period.

In implementations where the at least two grain size defining parameters comprises pressure of deposition chamber 205 in which the deposition is occurring, a starting pressure in the first time period can be in a range of about 0.2 Pa to about 2 Pa and an ending pressure in the first time period can be in a range of about 0.1 Pa to about 1 Pa. As such computing device 215 can be configured to control pressure control device 211 to control the pressure of deposition chamber 205 through a given range during the first time period and to hold the pressure of deposition chamber 205 constant during the second time period. It is further appreciated, however, that the pressure of deposition chamber 205 can one of: decrease over the first time period or increase over the first time period.

However, while method 300 is described with respect to sputtering, techniques described herein can include depositions that can comprise one or more of: sputtering, magnetron sputtering, CVD (chemical vapour deposition), PECVD (plasma-enhanced chemical vapour deposition), and MOCVD (metalorganic chemical vapour deposition). Sputtering and/or magnetron sputtering can include reactive RF magnetron sputtering, DC magnetron sputtering, pulsed DC magnetron sputtering and combinations thereof.

Figure 4A:
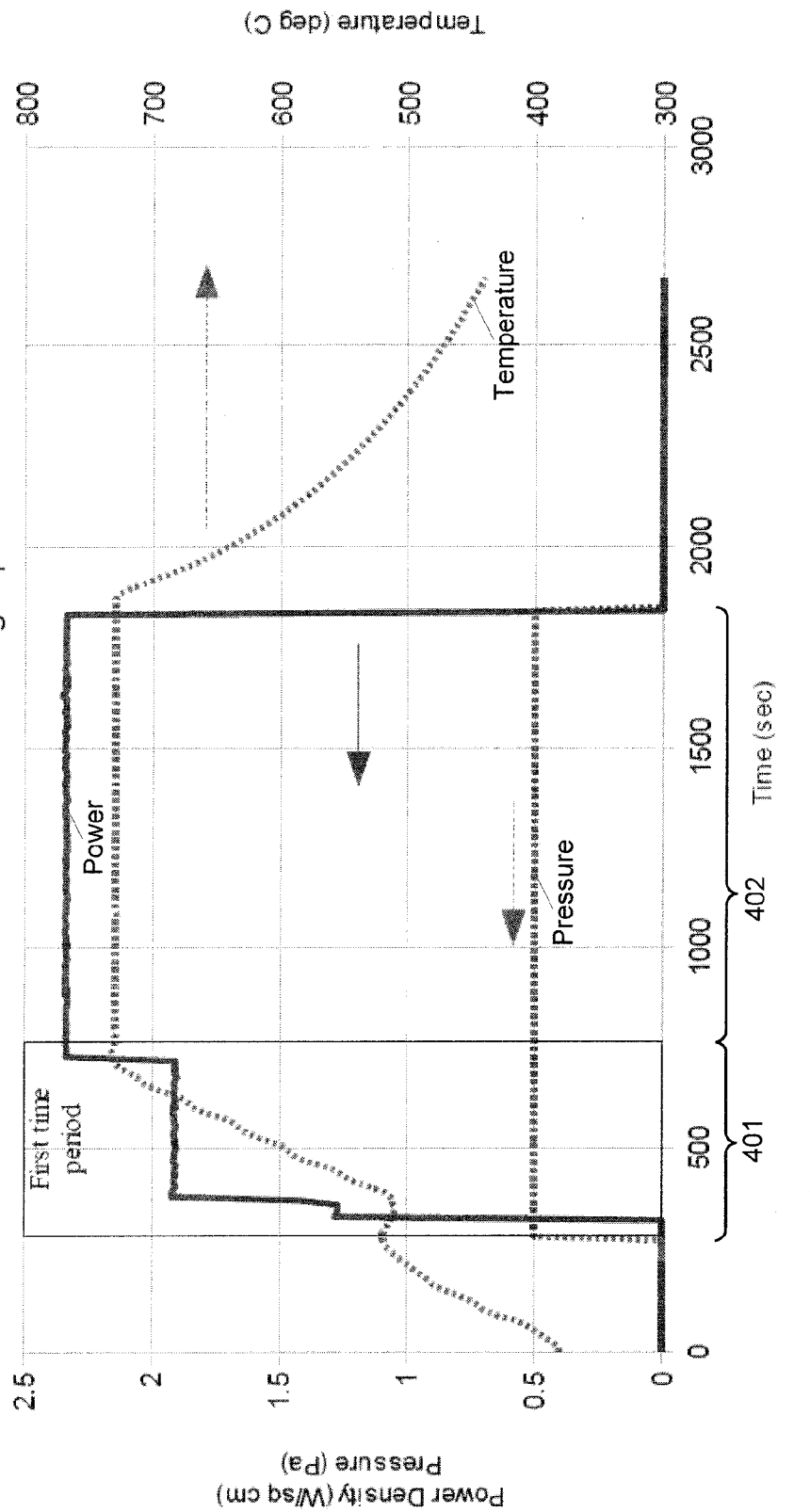
FIG. 4a depicts a graph of temperature and sputtering power curves of a non-limiting implementation of the method of FIG. 3, as well as a pressure curve, where pressure is held constant.

Attention is next directed to FIG. 4a which depicts a graph 400 of temperature and sputtering power curves of an implementation of method 300 according to non-limiting implementations, when method 300 is implemented in a sputter deposition system similar to system 200. In particular, in these implementations, sputtering of BST occurs where deposition pressure is held about constant: indeed a constant pressure curve is also depicted in FIG. 4a, at least over the period of time where sputtering is occurring (e.g.

over a first time period 401 and a second time period 402). Furthermore, in these implementations, sputtering of BST occurs where grain-size defining parameters of substrate temperature and sputtering power are provided with respective gradients over a first time period 401 (e.g. about 300 seconds to about 800 seconds) and are held constant over a second time period 402 (e.g. about 800 seconds to about 2000 seconds). The solid curve shows sputtering power as a function of time (with arbitrary power units shown on the left axis), the top stippled curve shows substrate temperature as a function of time (with arbitrary power units shown on the right axis), and the bottom stippled curve shows pressure as a function of time (with arbitrary pressure units shown on the left axis), the pressure being constant during first time period 401 and second time period 402.

In particular, in first time period 401, sputtering power is provided with a gradient that includes one or more steps and/or at least one temporary pause, but generally increases over first time period 401; in particular, sputtering power is held at about zero until substrate temperature reaches a given value (e.g. above a temperature for forming polycrystalline grains of the dielectric, and below a stress-relief temperature of a conductive electrode on which the dielectric is being formed), and then increases step wise over the remainder of the first time period 401. Furthermore, in first time period 401, while substrate temperature generally smoothly increases, substrate temperature can also decrease for at least a portion of the first time period (e.g. when the sputtering power first ramps from about zero through a first step). The sputtering power and substrate temperature in second time period 402 is held constant at the same respective values reached at the end of first time period 401.

In particular, sputtering plasma can be ignited at an idling temperature of the sputter deposition system (idling temperatures can be in a range of about 20° C. to about 300° C., as measured and controlled at the substrate). The ignition temperature can be lower than the stress relief temperature of the electrode (e.g. in a range of about 100° C. to about 600° C.). Deposition of tunable dielectric can be done at a high temperature (e.g. in a range of about 600° C. to about 1000° C.). The sputtering process can start with a temperature ramp superimposed with a sputtering power ramp; the ramp rate of both these parameters can be variable in order to achieve a desired grain size in the initial portion of the film. The changes can also be done in steps rather than in a continuous manner as step-wise variations in the parameters can result in a quicker change in the film grain structure. In graph 400, the temperature ramp is paused at around 500° C. while the power is changed in a step-wise manner with the maximum power and temperature arranged to be applied at the same time.

Hence, in block 301 of method 300, one or more of the respective gradients of the at least two grain size defining parameters can occur in one or more steps during the first time period. Similarly, in block 301 of method 300, one or more of the respective gradients can include a temporary pause in a change of the at least two grain size defining parameters during the first time period.

Furthermore, the first time period and the second time period can be varied relative to one another to control relative thicknesses of the portions the voltage-tunable dielectric material formed during the first time period and the second time period. In general, the first time period can be in a range of about 50% to about 100% of the second time period such that a first thickness of a first portion of the voltage-tunable dielectric material formed during the first time period is less than or about equal to a second thickness of a second portion of the voltage-tunable dielectric material formed during the second time period.

Figure 4B:
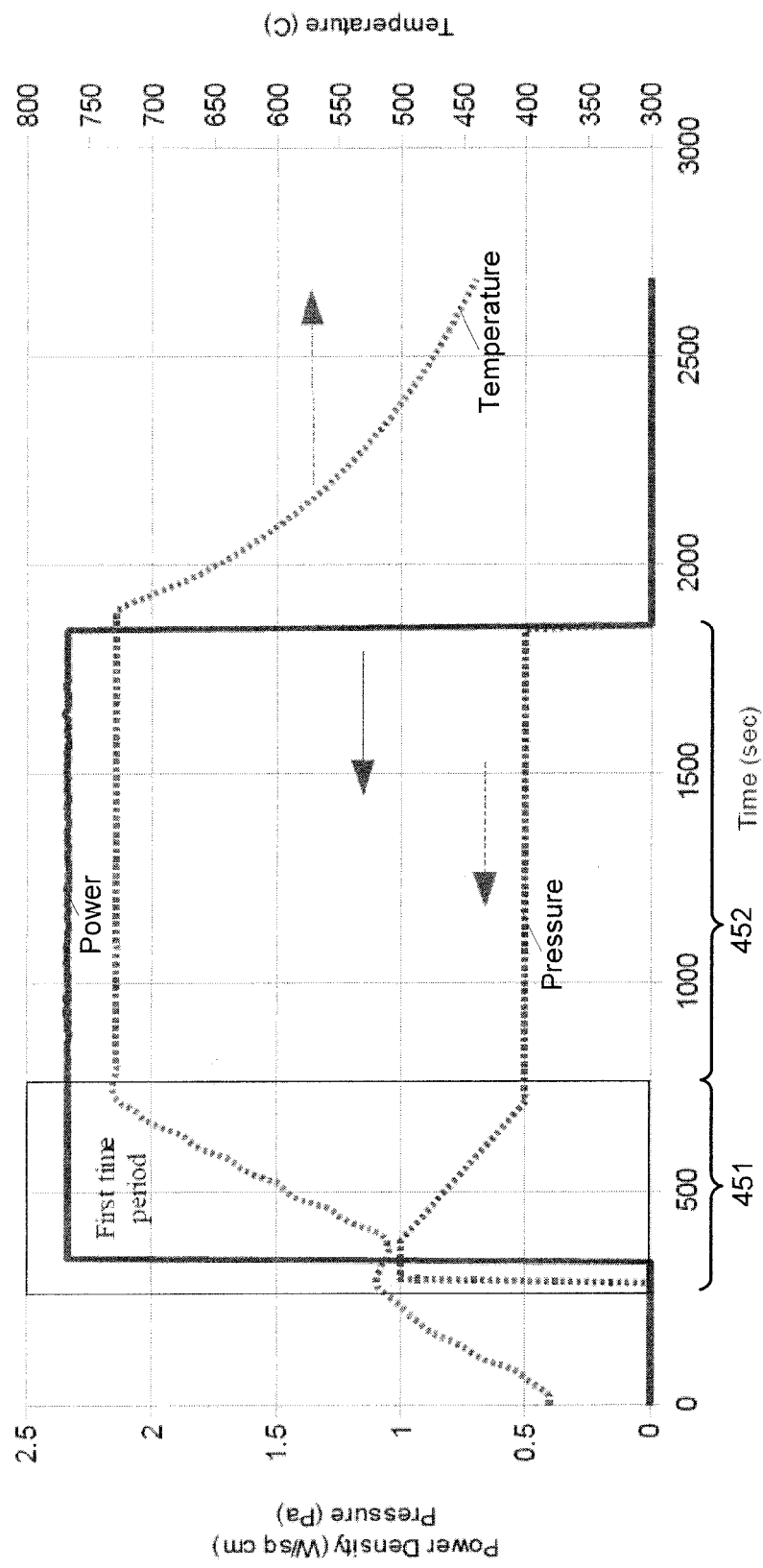
FIG. 4b depicts a graph of temperature and pressure curves of a non-limiting implementation of the method of FIG. 3, as well as a power curve, where power is held constant.

These concepts are also illustrated in FIG. 4b, which depicts a graph 450 of temperature and deposition pressure curves of an implementation of method 300 according to non-limiting implementations, when method 300 is implemented in a sputter deposition system similar to system 200. In particular, in these implementations, sputtering of BST occurs where sputtering power is held about constant: indeed a constant power curve is also depicted in FIG. 4b, at least over the period of time where sputtering is occurring (e.g. over a first time period 451 and a second time period 452). Furthermore, in these implementations, sputtering of BST occurs where grain-size defining parameters of substrate temperature and deposition pressure are provided with respective gradients over a first time period 451 (e.g. about 300 seconds to about 800 seconds) and are held constant over a second time period 452 (e.g. about 800 seconds to about 2000 seconds). The solid curve shows sputtering power as a function of time (with arbitrary power units shown on the left axis) and is constant during first time period 451 and second time period 452, the top stippled curve shows substrate temperature as a function of time (with arbitrary power units shown on the right axis), and the bottom stippled curve shows pressure as a function of time (with arbitrary pressure units shown on the left axis), the pressure decreasing over first time period 451. Unlike graph 400, in graph 450, each gradient in first time period 451 is a gradient without steps and/or temporary pauses, though temperature decreases initially when the plasma ignites, and pressure is briefly held constant over the same initial time period.

It is further appreciated that present techniques described herein can further comprise depositing a second conductive electrode on the voltage-tunable dielectric material after the second time period, for example to form a voltage-tunable capacitor.

Furthermore, present techniques described herein can further comprise repeating deposition of the voltage-tunable dielectric material onto the second conductive electrode, including: simultaneously providing further respective gradients in at least two grain size defining parameters of the deposition, the further respective gradients occurring for a third time period; when the third time period has ended, continuing deposition for a fourth time period where the grain size defining parameters are held constant; and depositing a third conductive electrode on the voltage-tunable dielectric material after the fourth time period. In other words, method 300 is repeated to form another voltage-tunable dielectric material thin film on the second conductive electrode and form a dual capacitor structure as described in further detail below. In general the referred to third time period corresponds to the first time period of block 301, and the referred to fourth time period corresponds to the second time period of block 303. However, when method 300 is repeated, respective gradients in at least two grain size defining parameters of the deposition provided in the third time period can be the same or different as those provided in the first time period; furthermore the grain size defining parameters that are varied in the third time period can be the same or different as those varied in the first time period.

Hence, present techniques provided herein can further comprise forming a capacitor on substrate 201 of one or more layers of the voltage-tunable dielectric material.

Figure 5:
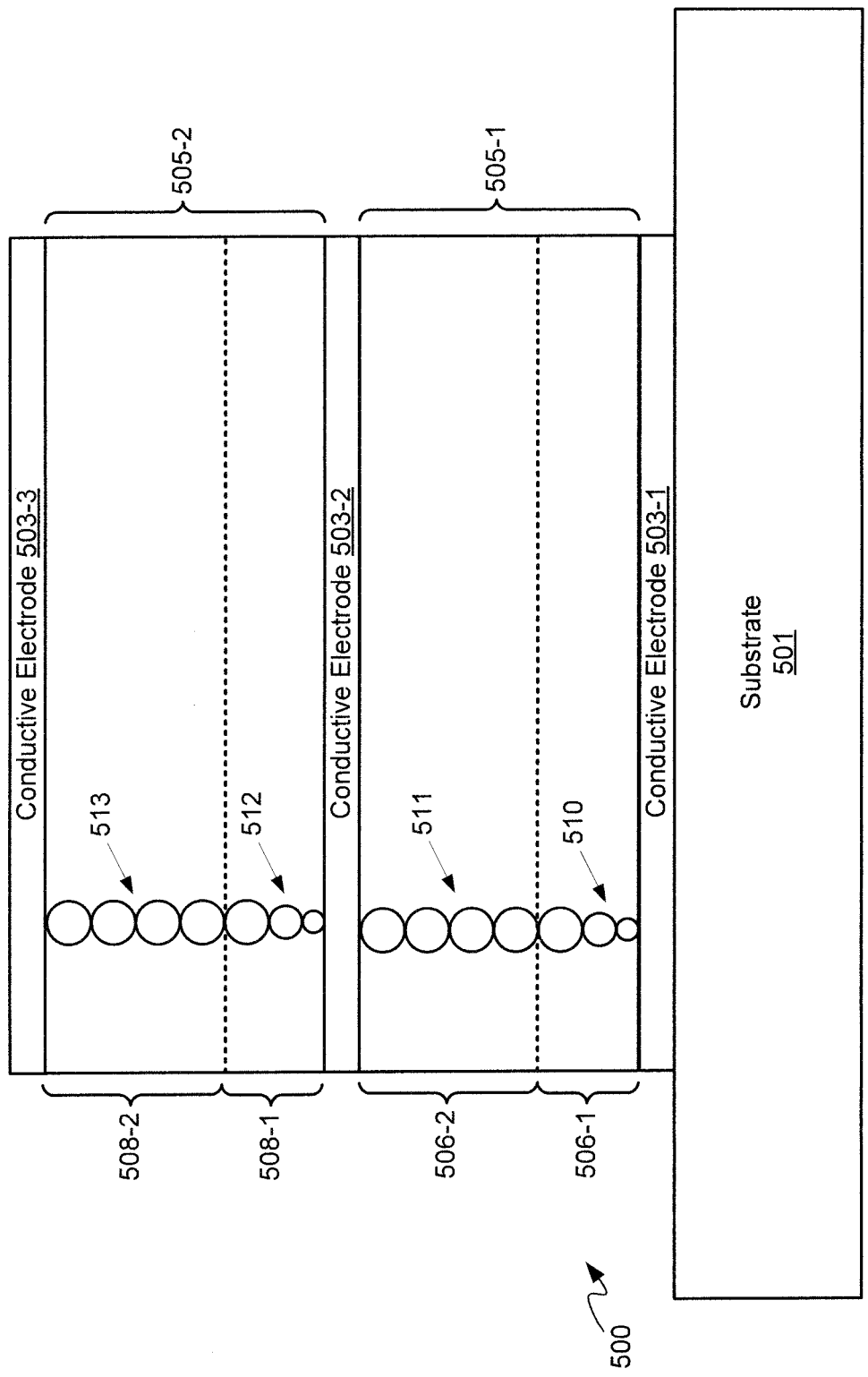
FIG. 5 depicts a schematic diagram of a voltage-tunable capacitive device formed using techniques described herein, according to non-limiting implementations.

For example, attention is next directed to FIG. 5 which depicts a schematic diagram of a voltage-tunable capacitive device 500 formed using techniques described herein. In particular device 500 comprises: a substrate 501; a first conductive electrode 503-1 on substrate 501; a voltage-tunable dielectric material 505-1 on first conductive electrode 503-1, voltage-tunable dielectric material 505-1 comprising: a first portion 506-1 adjacent first conductive electrode 503-1, first portion 506-1 comprising a smoothly changing columnar crystalline habit; and a second portion 506-2 on first portion 506-1, second portion 506-2 comprising a generally constant columnar crystalline habit; and, a second conductive electrode 503-2 on second portion 506-2 of the voltage-tunable dielectric material 505-1.

Hence, conductive electrodes 503-1, 503-2 sandwich voltage-tunable dielectric material 505-1 and form a voltage-tunable capacitor.

However, as depicted, device 500 further comprises: a second layer of voltage-tunable dielectric material 505-2 on second conductive electrode 503-2, voltage-tunable dielectric material 505-2 comprising: a first portion 508-1 adjacent first conductive electrode 503-1, first portion 508-1 comprising a smoothly changing columnar crystalline habit; and a second portion 508-2 on first portion 508-1, second portion 508-2 comprising a generally constant columnar crystalline habit; and, a third conductive electrode 503-3 on second portion 508-2 of the voltage-tunable dielectric material 505-2.

Hence, device 500 further comprises one or more of: a capacitor on substrate 501 comprising one or more layers of voltage-tunable dielectric material 505-1, 505-2; and more than one conductive electrode/dielectric/conductive electrode structure stacked on top of each other. Indeed, while a dual capacitor structure and/or dual conductive electrode/dielectric/conductive electrode structure is depicted in FIG. 5, in other implementations, device 500 can comprise one capacitor, two capacitors structures (i.e. as depicted in FIG. 5), or more than two capacitor structures.

In general, substrate 501 can be similar to substrate 201, while each of conductive electrodes 503-1, 503-2, 503-3 can be similar to conductive electrodes 203.

Furthermore each of voltage-tunable dielectric material 505-1, 505-2 can be formed using method 300.

FIG. 4 further depicts, schematically, a columnar crystalline habit of each of first portion 506-1, second portion 506-2, first portion 508-1, and second portion 508-2. In particular, grains 510 of first portion 506-1 are schematically depicted as smoothly increasing in a column such that columnar crystalline habit of voltage-tunable dielectric material 505-1 in first portion 506-1 is smoothly changing, for example from first width adjacent first conductive electrode 503-1 to a second width larger than the first width distal first conductive electrode 503-1. Grains 511 of second portion 506-2 are about constant such that columnar crystalline habit of voltage-tunable dielectric material 505-1 in second portion 506-2 is about constant. In particular, grains 511 in second portion 506-2 are about a same size as grains of first portion 506-1 located adjacent second portion 506-2, such that an interface there between is smooth and/or non-abrupt and/or reduced. Indeed, an interface between first portion 506-1 and second portion 506-2 is indicated using a stippled line to show that the interface is smooth. Grains 512 of first portion 508-1, and grains 513 of second portion 508-2 of voltage-tunable dielectric material 505-2 follow similar respective trends as grains 510 and grains 511. In general grains 510, 511, 512, 513 each form columns.

Hence, the smoothly changing columnar crystalline habit of block 301 of method 300 comprises columns of the voltage-tunable dielectric material changing from columns of a first width adjacent the conductive electrode to columns of a second width larger than the first width distal the conductive electrode. In particular, the smoothly changing columnar crystalline habit is intentionally, and smoothly, distorted using techniques described herein.

Figure 6:
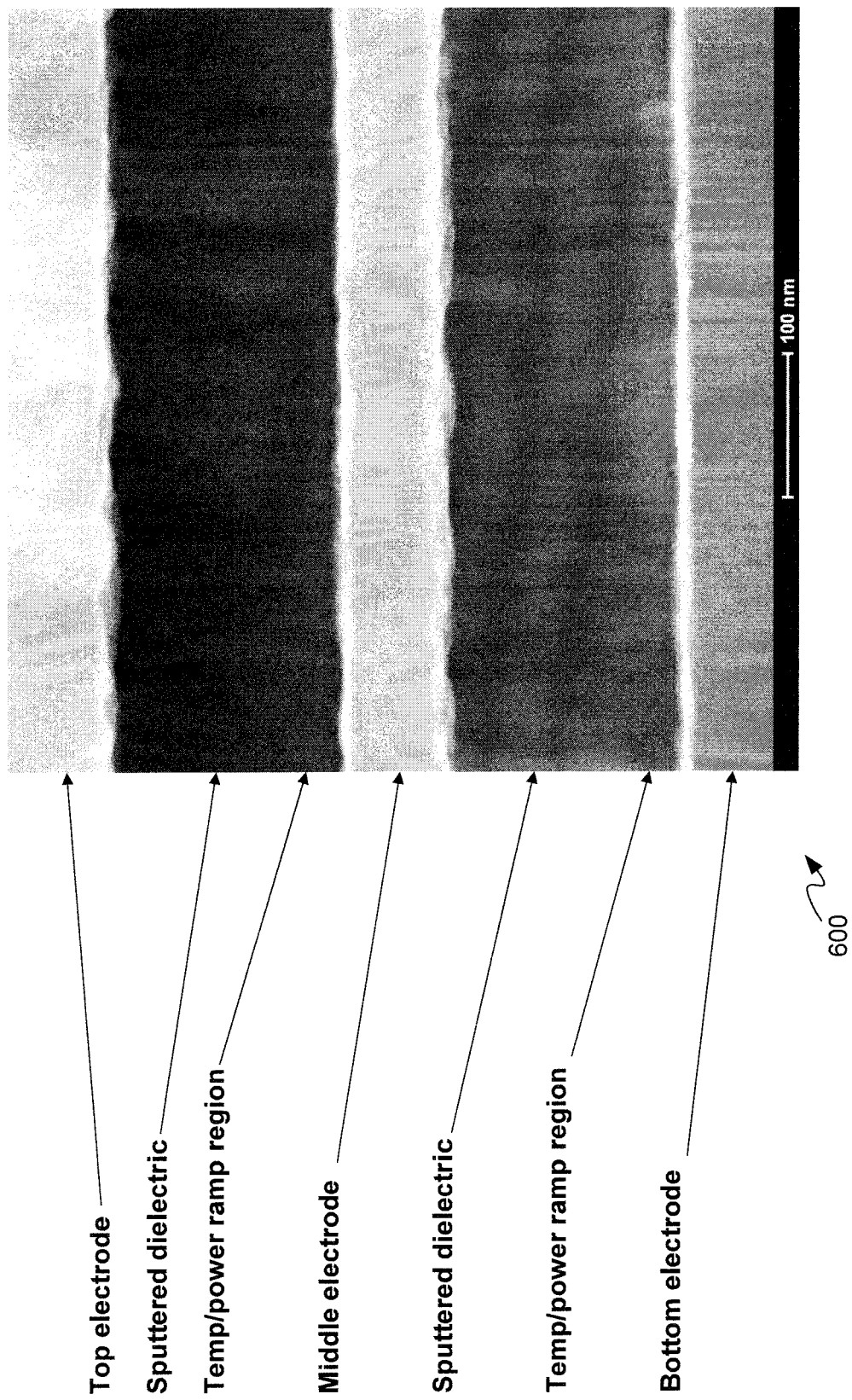
FIG. 6 depicts a TEM (transmission electron microscopy) micrograph of a successful prototype of a voltage-tunable dielectric capacitor formed using the method of FIG. 3.

Attention is next directed to FIG. 6 which depicts a TEM (transmission electron microscopy) micrograph 600 of a successful prototype of a voltage-tunable dielectric capacitor formed using method 300. The successful prototype is similar to device 500 and comprises a bottom electrode, a sputtered dielectric (of BST) having a portion adjacent the bottom electrode formed by simultaneously ramping substrate temperature and sputtering power, a middle electrode, a second sputtered dielectric (of BST) having a portion adjacent the middle electrode formed by simultaneously ramping substrate temperature and sputtering power, and a top electrode. It is appreciated from the micrograph that each of the portions formed by simultaneously ramping substrate temperature and sputtering power comprise a smoothly changing columnar crystalline habit, while the remaining portion of each sputtered dielectric has an about constant columnar crystalline habit with an interface there between being reduced and/or eliminated. In other words, the crystalline habit of the voltage-tunable dielectric capacitor of the successful prototype is intentionally, and smoothly distorted.

Measurements of the successful prototype, and other similar successful prototypes have generally shown that use of method 300 to form voltage-tunable dielectric capacitors can lead to better production throughput and lower production costs. In particular, the throughput of sputtering equipment can be increased for high temperature processing by using the previously unproductive temperature ramp time to deposit a portion of the dielectric film.

Such prototypes have also shown better reliability and breakdown voltages than comparable devices formed using prior art techniques (e.g. the device of FIG. 1). In particular, the columnar crystals in the dielectric film of the successful prototypes are distorted due to the power and temperature ramps during deposition. This can impede the formation of dendrites from the electrodes and can improve the time dependent dielectric breakdown (TDDB) and further can improve mean time to failure (MTTF) of the capacitor. Furthermore, the deposition during the ramp prevents the electrode from creating stress-relief hillocks which degrade reliability and reduce breakdown voltages, assuming that the initial temperature at the beginning of block 301 is less than a stress-relief temperature of the conductive electrode.

Such prototypes have also shown better performance than comparable devices formed using prior art techniques, and in particular space-charge effects are reduced in both the dielectric and at the dielectric—electrode interfaces, which has shown more repeatable capacitance versus voltage curves over the product life. For example, space charges create losses in the dielectric and hence reduction of these charges reduces the high-frequency losses and can enable a wider range of applications.

Improvement was also observed in capacitance hysteresis with relaxation time of the successful prototypes, as compared to than comparable devices formed using prior art techniques. In particular, formation of dielectric materials using method 300 creates a more uniform stress environment and a lower space charge at both the lower electrode interface which improves the relaxation time of the capacitor.

Improvement was also observed in high frequency Q-factor losses of the successful prototypes, as compared to comparable devices formed using prior art techniques. For example, a critical parameter in RF (radio-frequency) systems can be loss in various parts of the system which degrades signal-to-noise ratio. Such losses must be minimized in an RF device for it to be useable; when the losses are low the device is more useable and has wider applications. Measurements of the successful prototypes, as compared to comparable devices formed using prior art techniques showed reduced charge that cause RF losses in the dielectric.

Those skilled in the art will appreciate that in some implementations, the functionality of computing device 115 can be implemented using pre-programmed hardware or firmware elements (e.g., application specific integrated circuits (ASICs), electrically erasable programmable read-only memories (EEPROMs), etc.), or other related components. In other implementations, the functionality of computing device 115 can be achieved using a computing apparatus that has access to a code memory (not depicted) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, the computer-readable program can be stored as a computer program product comprising a computer usable medium. Further, a persistent storage device can comprise the computer readable program code. The computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A method of deposition of a voltage-tunable dielectric material onto a substrate comprising a conductive electrode, the method comprising:
   simultaneously providing respective gradients in at least two grain size defining parameters of the deposition, the respective gradients occurring for a first time period thereby producing a smoothly changing columnar crystalline habit of the voltage-tunable dielectric material, a first grain size defining parameter, of the at least two grain size defining parameters, comprises substrate temperature, a starting substrate temperature in the first time period being in a range of about 20° C. to about 300° C. and an ending substrate temperature in the first time period being in a range of about 600° C. to about 1000° C., and a second grain size defining parameter, of the at least two grain size defining parameters, comprises one or more of deposition power, and pressure of a deposition chamber in which the deposition is occurring; and,
   when the first time period has ended, continuing deposition for a second time period where the grain size defining parameters are held constant.

2. The method of claim 1, wherein a film of the voltage-tunable dielectric material formed on the conductive electrode during the deposition is polycrystalline.

3. The method of claim 1, wherein the starting substrate temperature in the first time period is below a stress relief temperature of the conductive electrode.

4. The method of claim 1, wherein when the deposition comprises sputtering, and the second grain size defining parameter comprises the deposition power, a starting sputtering power in the first time period is about 0 W/cm$^2$ and an ending sputtering power in the first time period is in a range of about 0.7 W/cm$^2$ to about 2.8 W/cm$^2$.

5. The method of claim 1, wherein when the second grain size defining parameter comprises the pressure of the deposition chamber in which the deposition is occurring, a starting pressure in the first time period is in a range of about 0.2 Pa to about 2 Pa and an ending pressure in the first time period is in a range of about 0.1 Pa to about 1 Pa.

6. The method of claim 1, wherein when the second grain size defining parameter comprises the pressure of the deposition chamber in which the deposition is occurring, the pressure one of: decreases over the first time period or increases over the first time period.

7. The method of claim 1, wherein the deposition comprises is one or more of: sputtering, magnetron sputtering, CVD (chemical vapour deposition), PECVD (plasma-enhanced chemical vapour deposition), and MOCVD metalorganic chemical vapour deposition).

8. The method of claim 1, wherein one or more of the respective gradients occur in one or more steps during the first time period.

9. The method of claim 1, wherein one or more of the respective gradients comprise a temporary pause in a change of the at least two grain size defining parameters during the first time period.

10. The method of claim 1, wherein the first time period is in a range of about 50% to about 100% of the second time period.

11. The method of claim 1, further comprising depositing a second conductive electrode on the voltage-tunable dielectric material after the second time period.

12. The method of claim 11, further comprising repeating deposition of the voltage-tunable dielectric material onto the second conductive electrode, including: simultaneously providing further respective gradients in at least two grain size defining parameters of the deposition, the further respective gradients occurring for a third time period; when the third time period has ended, continuing deposition for a fourth time period where the grain size defining parameters are held constant; and depositing a third conductive electrode on the voltage-tunable dielectric material after the fourth time period.

13. The method of claim 1, further comprising forming a capacitor on the substrate of one or more layers of the voltage-tunable dielectric material.

14. The method of claim 1, wherein the smoothly changing columnar crystalline habit comprises columns of the voltage-tunable dielectric material changing from columns of a first width adjacent the conductive electrode to columns of a second width larger than the first width distal the conductive electrode.

15. The method of claim 1, wherein the voltage-tunable dielectric material comprises one or more of a ferroelectric material, a perovskite material, a pyrochlore material, barium strontium titanate (BST), lead zirconate titanate (PZT), lead lanthanum zirconate titanate (PLZT), strontium bismuth tantalate (SBT), lithium niobate, bismuth lanthanum titanate (BLT), and lead scandium titanate.

16. A system for depositing a voltage-tunable dielectric material onto a substrate comprising a conductive electrode, the system comprising:
  a deposition chamber; a substrate holder configured to hold the substrate; a substrate temperature control device; a pressure control device configured to control pressure in the deposition chamber; a power control device configured to control deposition power; and a computing device configured to control the substrate temperature control device, the pressure control device, and the power control device to:
  simultaneously provide respective gradients in at least two grain size defining parameters of the deposition, the respective gradients occurring for a first time period thereby producing a smoothly changing columnar crystalline habit of the voltage-tunable dielectric material, a first grain size defining parameter, of the at least two grain size defining parameters, comprises the substrate temperature, a starting substrate temperature in the first time period being in a range of about 20° C. to about 300° C. and an ending substrate temperature in the first time period being in a range of about 600° C. to about 1000° C., and a second grain size defining parameter, of the at least two grain size defining parameters, comprises one or more of the deposition power, and the pressure of the deposition chamber; and,
  when the first time period has ended, continue deposition for a second time period where the grain size defining parameters are held constant.

* * * * *